United States Patent
Kim et al.

(10) Patent No.: US 9,030,826 B2
(45) Date of Patent: May 12, 2015

(54) CHIP-ON-FILM PACKAGES AND DEVICE ASSEMBLIES INCLUDING THE SAME

(75) Inventors: Jichul Kim, Yongin-si (KR); Jae Choon Kim, Incheon (KR); Young-deuk Kim, Suwon-si (KR); Eunseok Cho, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 322 days.

(21) Appl. No.: 13/535,967

(22) Filed: Jun. 28, 2012

(65) Prior Publication Data

US 2013/0021768 A1    Jan. 24, 2013

(30) Foreign Application Priority Data

Jul. 22, 2011  (KR) ................. 10-2011-0072911

(51) Int. Cl.
| | | |
|---|---|---|
| H05K 7/20 | (2006.01) | |
| H01L 23/34 | (2006.01) | |
| H01L 23/498 | (2006.01) | |
| H01L 23/36 | (2006.01) | |
| H01L 23/373 | (2006.01) | |

(52) U.S. Cl.
CPC ............ *H01L 23/4985* (2013.01); *H01L 23/36* (2013.01); *H01L 23/3736* (2013.01); *H01L 2224/16225* (2013.01)

(58) Field of Classification Search
CPC .............. H05K 7/20445; H05K 7/209; H05K 7/20545; H05K 1/0206; H05K 3/0061; H05K 3/0058; B41J 29/377; H01L 23/4006; H01L 23/433; H01L 23/36; H01L 23/4093; H01L 23/467; G06F 1/20
See application file for complete search history.

(56) References Cited

U.S. PATENT DOCUMENTS

| | | | |
|---|---|---|---|
| 4,290,828 A | 9/1981 | Aisaka et al. | |
| 7,253,870 B2 | 8/2007 | Yang | |
| 7,460,196 B2 * | 12/2008 | Kim et al. | 349/64 |
| 7,583,020 B2 * | 9/2009 | Yamazaki | 313/504 |
| 7,915,727 B2 | 3/2011 | Choi et al. | |
| 2006/0001156 A1 * | 1/2006 | Wakiyama et al. | 257/737 |
| 2006/0089023 A1 * | 4/2006 | Kim | 439/96 |
| 2006/0258061 A1 * | 11/2006 | Jung et al. | 438/149 |
| 2006/0291153 A1 * | 12/2006 | Bae | 361/681 |
| 2007/0230132 A1 * | 10/2007 | Lee | 361/707 |
| 2008/0013030 A1 | 1/2008 | Fujita | |
| 2008/0030646 A1 * | 2/2008 | Go | 349/62 |
| 2008/0112186 A1 * | 5/2008 | Jung et al. | 362/609 |
| 2008/0310130 A1 * | 12/2008 | Monda et al. | 361/752 |
| 2009/0034180 A1 * | 2/2009 | Lee | 361/681 |
| 2009/0059130 A1 * | 3/2009 | Kim et al. | 349/65 |

(Continued)

FOREIGN PATENT DOCUMENTS

| | | |
|---|---|---|
| JP | 2009-267286 | 11/2009 |
| KR | 10-2006-0080450 A | 7/2006 |
| KR | 10-2007-0003016 A | 1/2007 |

*Primary Examiner* — Hoa C Nguyen
*Assistant Examiner* — Xanthia C Cunningham
(74) *Attorney, Agent, or Firm* — Muir Patent Law, PLLC

(57) ABSTRACT

Chip-on-film packages are provided. A chip-on-film package includes a film substrate having a first surface and a second surface opposite to each other, a semiconductor chip on the first surface, and a thermal deformation member adjacent to the second surface. The thermal deformation member has a construction that causes its shape to transform according to a temperature. Related devices and device assembles are also provided.

17 Claims, 10 Drawing Sheets

(56) References Cited

U.S. PATENT DOCUMENTS

2009/0167638 A1* 7/2009 Lee et al. .................... 345/55
2010/0002404 A1* 1/2010 Fujita et al. ................. 361/752
2010/0044871 A1* 2/2010 Katoh et al. ................. 257/773
2010/0084073 A1* 4/2010 Komatsu et al. ............. 156/60
2011/0032447 A1* 2/2011 Park et al. ................... 349/58
2011/0228484 A1 9/2011 Sundstrom et al.
2011/0292562 A1* 12/2011 Lee et al. .................... 361/234
2012/0050634 A1* 3/2012 Kim et al. ................... 349/58
2012/0201006 A1* 8/2012 Markovich et al. .......... 361/712

* cited by examiner

CHIP-ON-FILM PACKAGES AND DEVICE ASSEMBLIES INCLUDING THE SAME

CROSS-REFERENCE TO RELATED APPLICATIONS

This U.S. non-provisional patent application claims priority under 35 U.S.C. §119 to Korean Patent Application No. 10-2011-0072911, filed on Jul. 22, 2011, the disclosure of which is hereby incorporated by reference in its entirety.

BACKGROUND

The present disclosure herein relates to semiconductor packages and, more particularly, to chip-on-film packages and device assemblies including the same.

In a recent electronic industry, chip-on-film packages (COFs) have been increasingly demanded with the development of thinner, lighter and smaller of electronic products. The chip-on-film package technology has been proposed to realize semiconductor packages having a highly integrated packing density of semiconductor chips. The chip-on-film packages may be realized using a flexible film substrate. According to the COF technology, semiconductor dies may be directly bonded to the flexible film substrate using a flip chip bonding technique and may be electrically connected to an external device with relatively short leads. Thus, the COF technology is very attractive because of the possibility of realization of fine and small interconnection patterns.

The COF packages may be applied to portable terminal units such as cellular phones or personal digital assistants (PDAs), laptop computers, or display units.

SUMMARY

Exemplary embodiments are directed to chip-on-film packages.

Further, exemplary embodiments are directed to device assemblies including the chip-on-film packages.

In an example embodiment, the chip-on-film package includes a film substrate having a first surface and a second surface opposite to each other, a semiconductor chip on the first surface, and a thermal deformation member adjacent to the second surface. A shape of the thermal deformation member has a construction that causes its shape to transform according to a temperature.

In one embodiment, the thermal deformation member may be a bimetal or a shape memory alloy. The bimetal may include a high expansion member and a low expansion member, and a distance between the low expansion member and the semiconductor chip may be less than a distance between the high expansion member and the semiconductor chip.

In one embodiment, the thermal deformation member may be attached to the second surface.

In another embodiment, the film substrate may include a first film substrate portion having the first surface and a second film substrate portion having the second surface, and the thermal deformation member may be disposed between the first film substrate portion and the second film substrate portion.

In one embodiment, the semiconductor chip may be disposed on a central portion of the film substrate. The thermal deformation member may have a bar shape in a plan view. A width of the thermal deformation member in a first direction may be greater than a width of the semiconductor chip in the first direction. The semiconductor chip and the thermal deformation member may intersect each other to constitute a cross shape in a plan view. The thermal deformation member may include a plurality of thermal deformation member portions, and the plurality of thermal deformation member portions are spaced apart from each other and are parallel with each other. The thermal deformation members portions may be disposed to be spaced apart from the semiconductor chip in a plan view.

In one embodiment, the thermal deformation member has a property that a curvature of the thermal deformation member at a first temperature is greater than a curvature of the thermal deformation member at a second temperature lower than the first temperature.

In another example embodiment, the device assembly includes a display panel, a frame supporting the display panel, and a chip-on-film package electrically connected to the display panel and disposed between the frame and the display panel. The chip-on-film package includes a film substrate having a first surface and a second surface opposite to each other, a semiconductor chip on the first surface, and a thermal deformation member adjacent to the second surface. The thermal deformation member has a construction that causes its shape transform according to a temperature.

In one embodiment, the frame and the chip-on-film package are positioned such that when the semiconductor chip is heated up, the chip-on-film package including the thermal deformation member may be warped to contact the frame. The frame and the chip-on-film package may be positioned such that when the semiconductor chip remains below a certain temperature, the chip-on-film package including the thermal deformation member does not contact the frame, and when the semiconductor chip is heated up above the certain temperature, the chip-on-film package including the thermal deformation member is warped to contact the frame In another embodiment, a method of manufacturing a device is disclosed. The method includes providing an outer casing formed of a heat-conductive material, providing a substrate including circuitry, and providing a chip-on-film package electrically connected to the substrate and disposed between the outer casing and the substrate. The chip-on-film package includes: a film substrate having a first surface and a second surface opposite to each other; a semiconductor chip on the first surface; and a shape transforming layer disposed between the semiconductor chip and the outer casing. The shape transforming layer includes one or more materials configured to adjust the shape of the film substrate when heat is applied to the film substrate.

In one embodiment, the method further includes positioning the frame and the chip-on-film package such that the chip-on-film package including the shape transforming layer does not contact the frame.

In one embodiment, the method includes: including at least two materials for the shape transforming layer, wherein a first material of the two materials is a high expansion material, and a second material of the two materials is a low expansion material; and positioning the second material between the first surface of the film substrate and the first material.

BRIEF DESCRIPTION OF THE DRAWINGS

The above and other features and advantages of the disclosure will become more apparent in view of the attached drawings and accompanying detailed description.

DETAILED DESCRIPTION OF THE EMBODIMENTS

Figure 1:
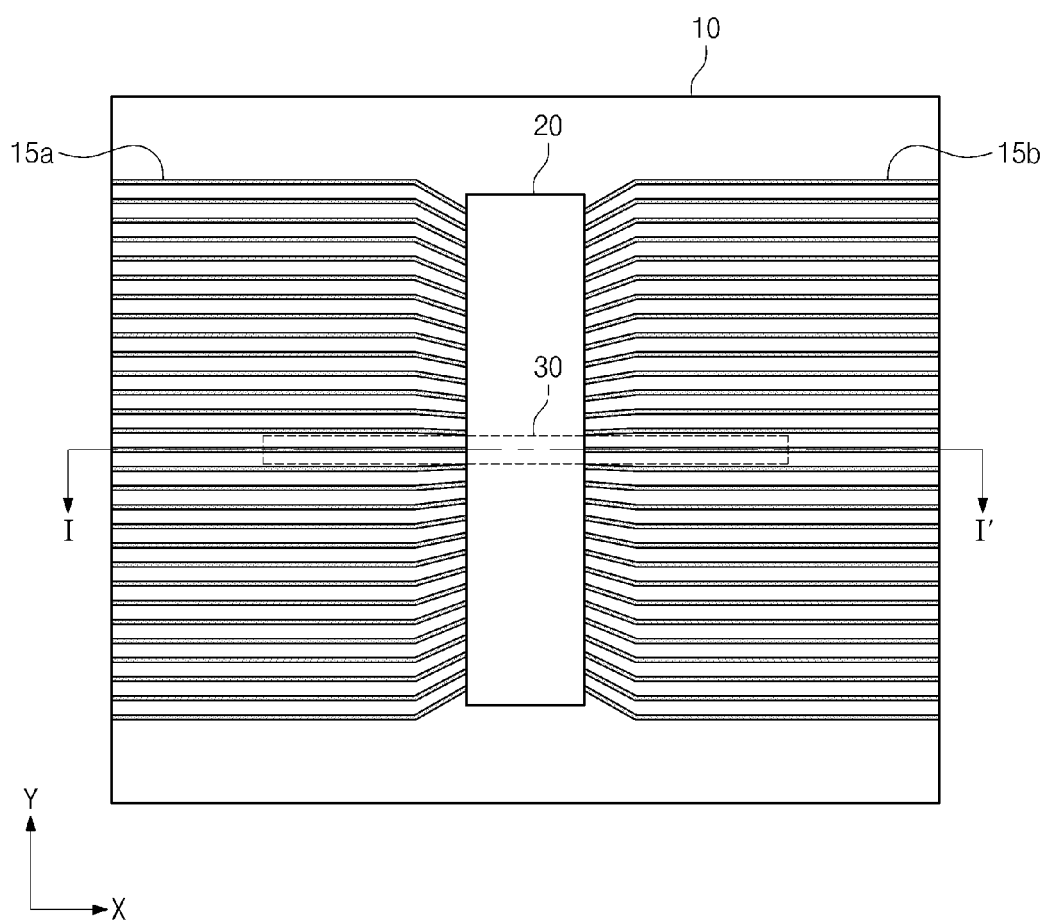
FIG. 1 is a layout diagram illustrating a chip-on-film package according to an exemplary embodiment.

Exemplary embodiments are described below with reference to the accompanying drawings. Many different forms and embodiments are possible without deviating from the spirit and teachings of this disclosure and so the disclosure should not be construed as limited to the exemplary embodiments set forth herein. In the drawings, the sizes and relative sizes of layers and regions may be exaggerated for clarity. Like reference numbers refer to like elements throughout.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present.

It will be understood that, although the terms first, second, etc. may be used herein to describe various elements, these elements should not be limited by these terms. Unless indicated otherwise, these terms are only used to distinguish one element from another. Thus, a first element could be termed a second element without departing from the teachings of the present embodiments.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein the term "and/or" includes any and all combinations of one or more of the associated listed items.

Figure 2:
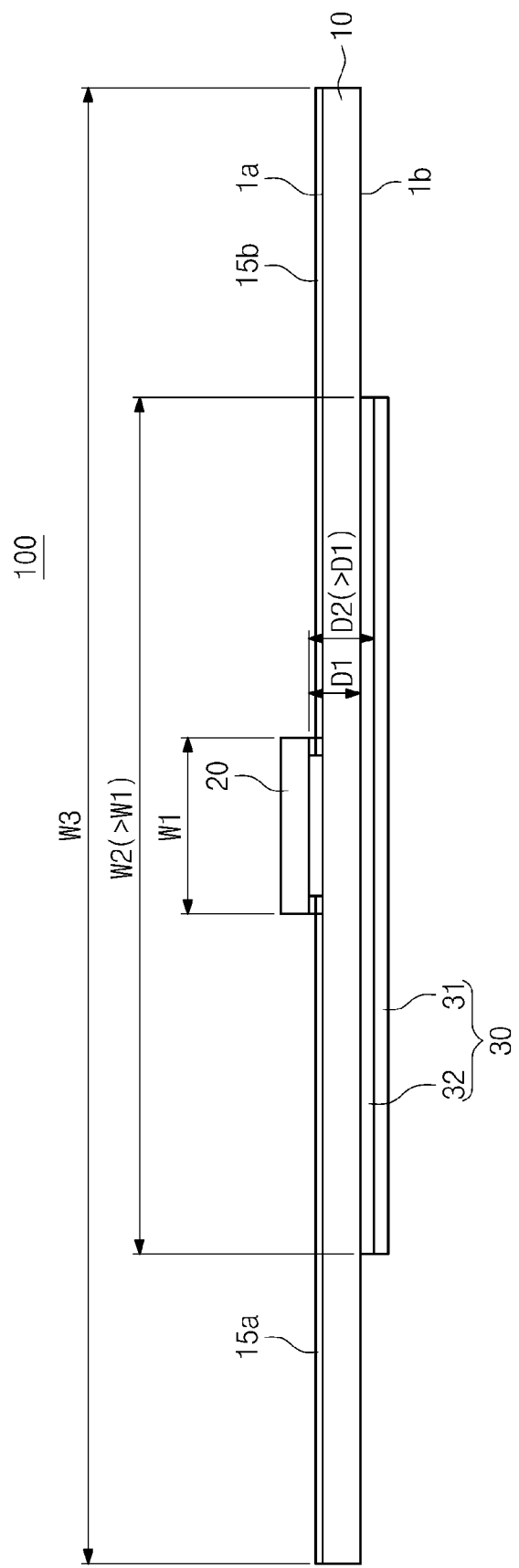
FIG. 2 is a cross sectional view taken along a line I-I' of FIG. 1, according to an exemplary embodiment.

FIG. 1 is a layout diagram illustrating a chip-on-film package according to an exemplary embodiment, and FIG. 2 is a cross sectional view taken along a line I-I' of FIG. 1.

Referring to FIGS. 1 and 2, a chip-on-film package 100 according to an exemplary embodiment may include a film substrate 10. The film substrate 10 may include a resin type material, for example, a polyimide material or a polyester material. Thus, the film substrate 10 may have flexibility, thus comprising a flexible, bendable substrate. The film substrate 10 may have a first surface 1a and a second surface 1b which are opposite to each other. A semiconductor chip 20 may be disposed on the first surface 1a opposite to the second surface 1b. The semiconductor chip 20 may have a bar shape extending in a first direction which is parallel with a Y-axis, when viewed from a plan view. The semiconductor chip 20 may be attached onto the film substrate 10 by a flip chip bonding method using a tab automated bonding (TAB) technique. First interconnections 15a and second interconnections 15b may be disposed on the first surface 1a. The first and second interconnections may include, for example, leads or other conductive lines formed from a conductive material (e.g., a metal such as copper). Although not shown in detail in the drawings, input/output terminals (e.g., conductive balls, bumps, etc.) may be disposed on the interconnections 15a and 15b, and the remaining portions of the interconnections 15a and 15b that are not covered with the input/output terminals may be covered with an insulation layer (e.g., a solder resist layer). The insulation layer may be disposed to protect the interconnections 15a and 15b from an external environment.

Subsequently, a thermal deformation member 30 may be disposed adjacent to the second surface 1b (e.g., on the second surface 1b opposite to the first surface 1a). In one embodiment, the thermal deformation member 30 contacts the second surface 1b. The thermal deformation member 30 may have a property that its shape is transformed according to a temperature. For example, when a temperature changes from a first temperature to a second temperature higher than the first temperature, the shape of the thermal deformation member 30 may change to have, for example, a greater curvature. The thermal deformation member 30 is also referred to herein as a shape transforming layer. In one exemplary embodiment, the thermal deformation member 30 may be disposed on a central portion of the film substrate 10. The thermal deformation member 30 may have a bar shape extending in a second direction intersecting the first direction, when viewed from a plan view. The second direction may be perpendicular to the first direction in a plan view. That is, the second direction may be parallel with an X-axis. Such an arrangement may be useful to maintain an even and balanced curvature for the film substrate 10. A width W1 of the semiconductor chip 20 in the second direction (the X-axis direction) may be less than a width W2 of the thermal deformation member 30 in the second direction. The width W1 may be significantly less than the width W2. In one embodiment, the width W1 is between 20% and 50% of the width W2. The width W2 of the thermal deformation member 30 in the second direction may be less than a width W3 of the film substrate 10 in the second direction. For example, the width W2 may be between 40% and 80% of the width W3.

A central point of the thermal deformation member 30 may be vertically aligned with a central point of the semiconductor chip 20 in a vertical cross sectional view. The semiconductor chip 20 and the thermal deformation member 30 may intersect each other to constitute a cross shape in a plan view, as illustrated in FIG. 1.

Figure 3:
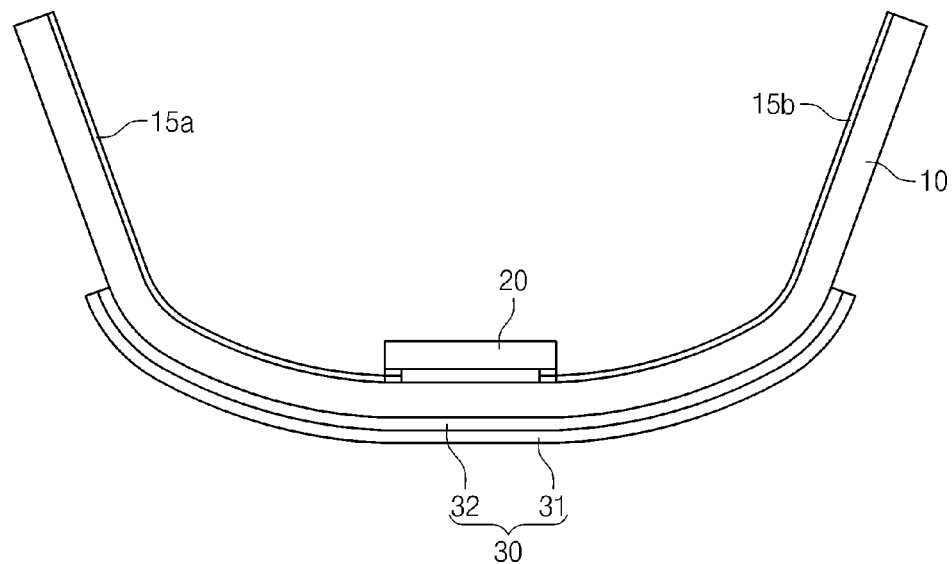
FIG. 3 is a cross sectional view illustrating a transformed shape of the chip-on-film package of FIG. 2, according to an exemplary embodiment.

The thermal deformation member 30 may comprise a layer of one or more materials that form a shape transforming layer. For example, in one embodiment, the thermal deformation member 30 is a bimetal. When the thermal deformation member 30 is a bimetal, the thermal deformation member 30 may include at least a first metal member 31 (hereinafter, referred to as a high expansion member) having a relatively high coefficient of thermal expansion and a second metal member 32 (hereinafter, referred to as a low expansion member) having a relatively low coefficient of thermal expansion. For example, a thermal expansion coefficient of the high expansion member 31 may be greater than that of the low expansion member 32. The differences in coefficients of thermal expansion may differ enough so that when the two members are stacked on and adhered to each other to form a shape transforming layer, when a temperature of the layer reaches a certain level, the shape transforming layer warps (e.g., bends) to have a greater amount of curvature. In certain embodiments, high expansion member 31 may have a coefficient of thermal expansion significantly higher than that of the low expansion member 32 (e.g., between two and twenty-five times that of the low expansion member 32). In one embodiment, the high expansion member 31 includes an alloy of nickel, chrome and iron, and the low expansion member 32 includes an alloy of nickel and iron. However, other materials can be used. The low expansion member 32 may be attached to the second surface 1b and the high expansion member 31 may be attached to the low expansion member 32. Thus, the low expansion member 32 may be located between the second surface 1b and the high expansion member 31, and a distance D1 between the semiconductor chip 20 and the low expansion member 32 may be less than a distance D2 between the semiconductor chip 20 and the high expansion member 31. As a result, when a temperature around the thermal deformation member 30 rises up, the thermal deformation member 30 may warp such that both edges of the thermal deformation member 30 move toward the semiconductor chip 20, or such that a center of the thermal deformation member 30 moves away from the edges of the film substrate 10. As such, the thermal deformation member 30 may warp to have a 'U'-shaped sectional view, as illustrated in FIG. 3. In some embodiments, the thermal deformation member 30 may have the 'U'-shaped sectional view at a room temperature.

Figure 4:
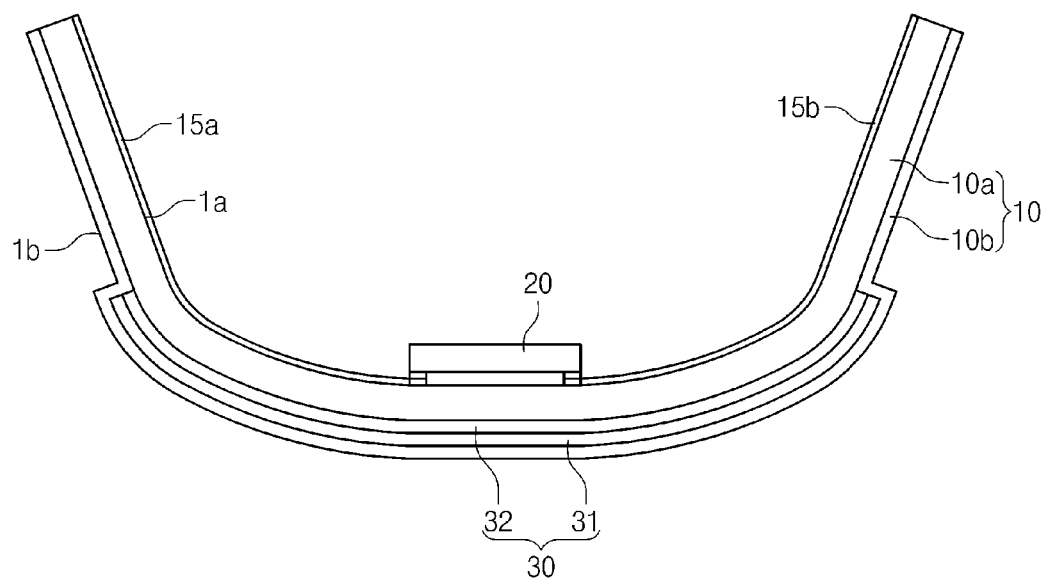
FIGS. 4 and 5 are cross sectional views illustrating chip-on-film packages according to other exemplary embodiments.
Figure 5:
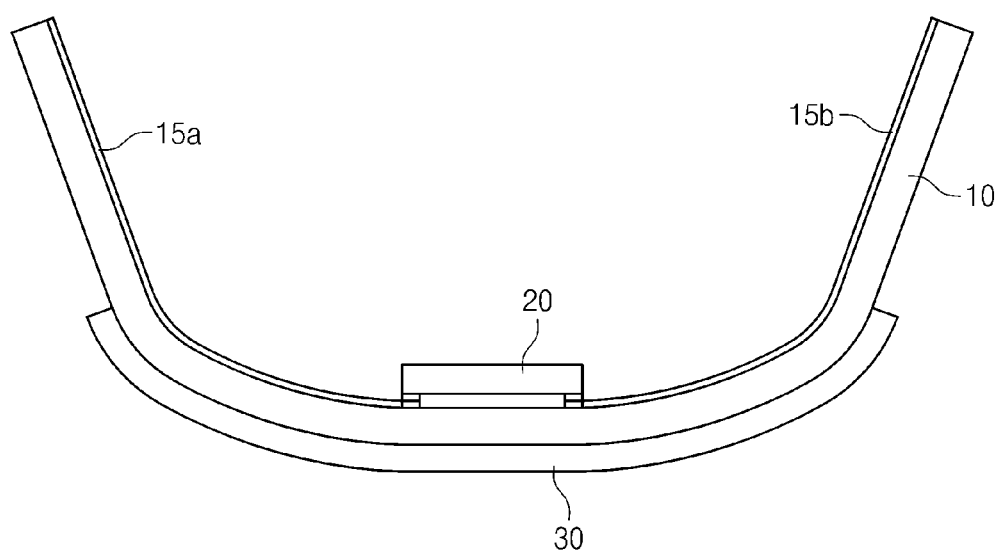

FIGS. 4 and 5 are cross sectional views illustrating chip-on-film packages according to other exemplary embodiments.

Referring to FIG. 4, a film substrate 10 may be provided. The film substrate 10 may be configured to include a plurality of film substrate portions. For example, the film substrate 10 may include a first film substrate 10a forming a first portion of film substrate 10 and a second film substrate 10b forming a second portion of film substrate 10, which are vertically stacked. A surface of the first film substrate 10a opposite to the second film substrate 10b may correspond to a first surface 1a, and a surface of the second film substrate 10b opposite to the first film substrate 10a may correspond to a second surface 1b. A thermal deformation member 30, such as described in the previous embodiment, may be disposed between the first and second film substrates 10a and 10b. If a bimetal is used to construct thermal deformation member 30, a low expansion member 32 may be positioned between a first surface 1a of the substrate 10 and a high expansion member 31. The first and second film substrates 10a and 10b may contact each other at edges of the film substrate 10. Thus, even though a shape of the thermal deformation member 30 may be repeatedly changed according to a temperature variation, the film substrate 10 may prevent the thermal deformation member 30 from being detached from the film substrate 10 since the thermal deformation member 30 is surrounded by the first and second film substrates 10a and 10b. As a result, the reliability of the chip-on-film package may be improved.

Referring to FIG. 5, while the film substrate 10 has the same structure as described with reference to FIGS. 1 to 3, the thermal deformation member 30 may be a shape memory alloy. For example, the thermal deformation member 30 may be a shape transforming layer constructed with a single film unlike the bimetal including a plurality of films. The shape memory alloy may be restored to a memorized shape at a specific temperature. The shape memory alloy may include at least one metal of copper, zinc, aluminum, nickel and titanium. In one exemplary embodiment, the thermal deformation member 30 may have a property that a curvature of the thermal deformation member 30 at a relatively high temperature is substantially greater than a curvature of the thermal deformation member 30 at a relatively low temperature.

The thermal deformation member 30 including the shape memory alloy may be attached to the second surface 1b of the film substrate 10, as illustrated in FIG. 5. However, in the exemplary embodiment illustrated in FIG. 4, the thermal deformation member 30 including a bimetal may be replaced with the thermal deformation member 30 including the shape memory alloy. That is, the deformation member 30 including the shape memory alloy may be disposed between the first film substrate 10a and the second film substrate 10b illustrated in FIG. 4 instead of the deformation member 30 including the bimetal.

Figure 6:
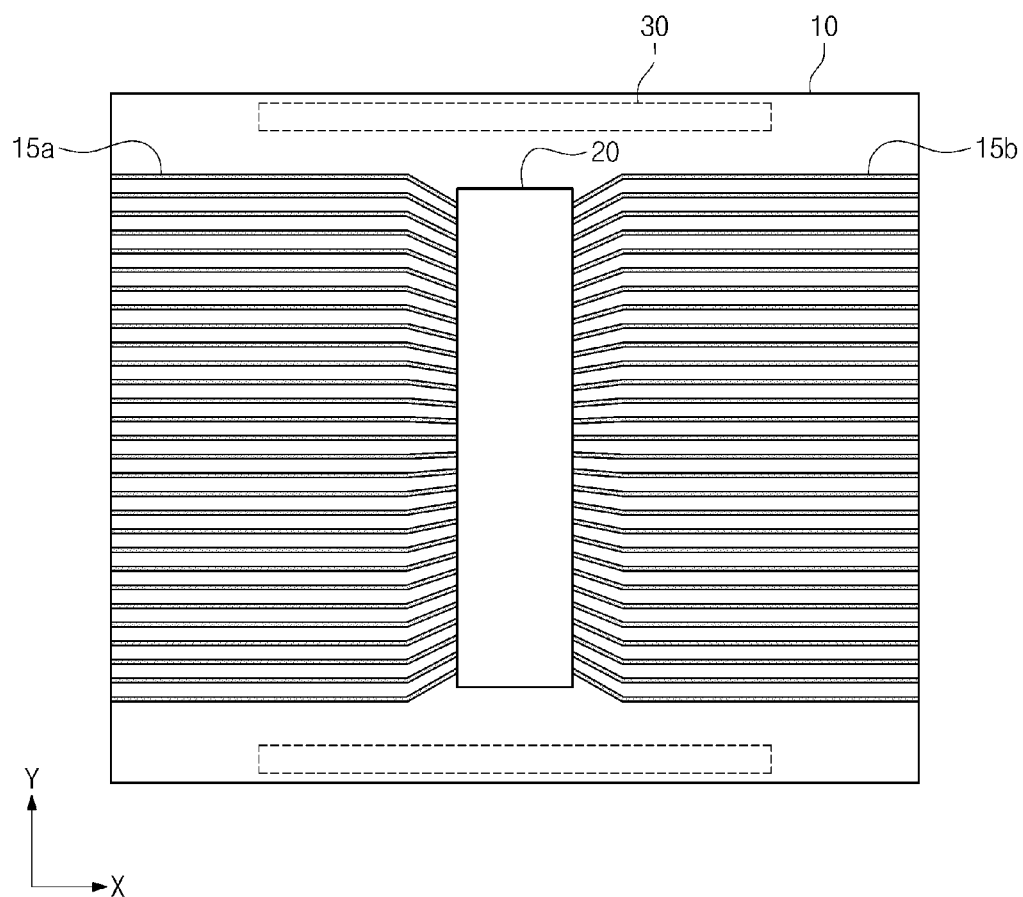
FIGS. 6 and 7 are layout diagrams illustrating chip-on-film packages according to yet other exemplary embodiments.
Figure 7:
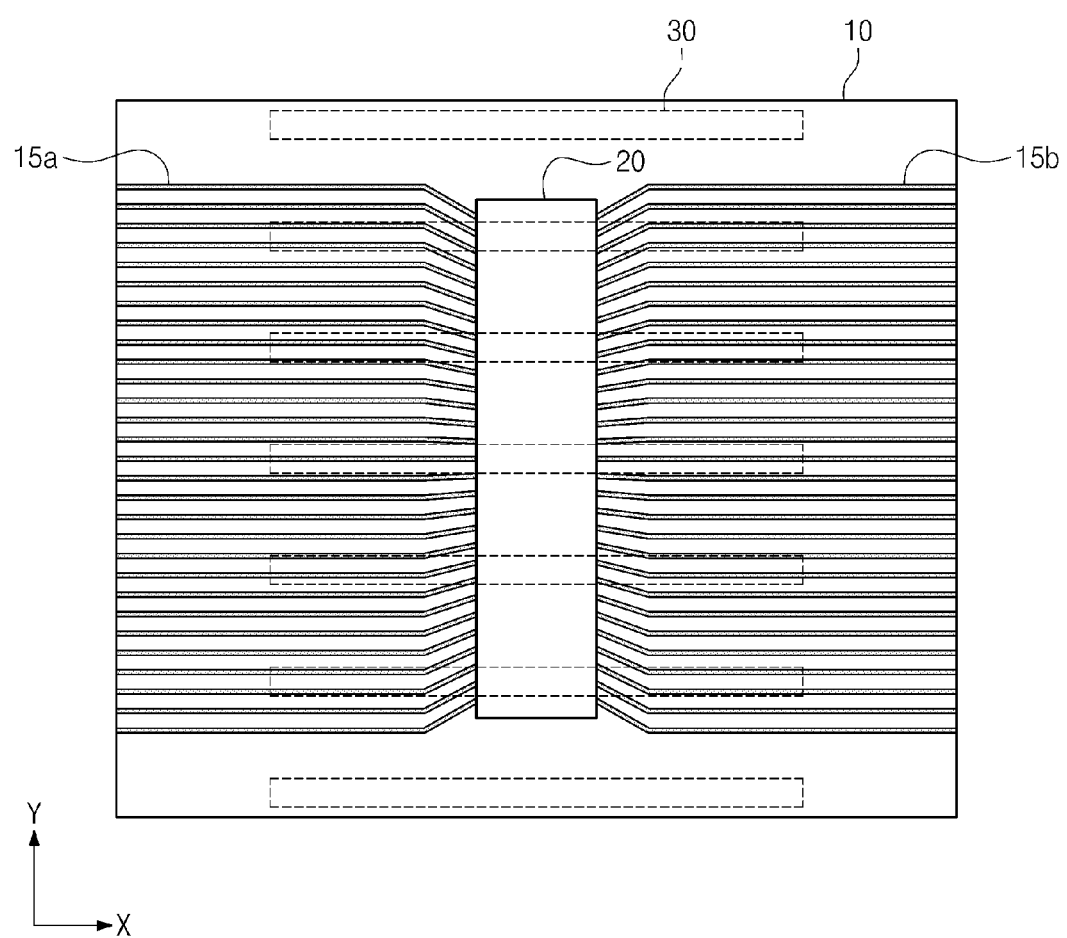

FIGS. 6 and 7 are layout diagrams illustrating chip-on-film packages according to yet other exemplary embodiments.

Referring to FIG. 6, a pair of thermal deformation members 30 may be disposed to be parallel with each other and to be spaced apart from each other. As illustrated in FIG. 6, the thermal deformation members 30 may not overlap with the semiconductor chip 20 in a plan view. Further, the pair of thermal deformation members 30 may be disposed to be spaced apart from both ends of the semiconductor chip 20, respectively. The pair of thermal deformation members 30 may be disposed at both ends of the film substrate 10, respectively.

Referring to FIG. 7, three or more thermal deformation members 30 may be disposed to be parallel with each other and to be spaced apart from each other.

Now, device assemblies including the chip-on-film packages 100 according to exemplary embodiments will be described with reference to FIGS. 8, 9 and 10.

Figure 8:
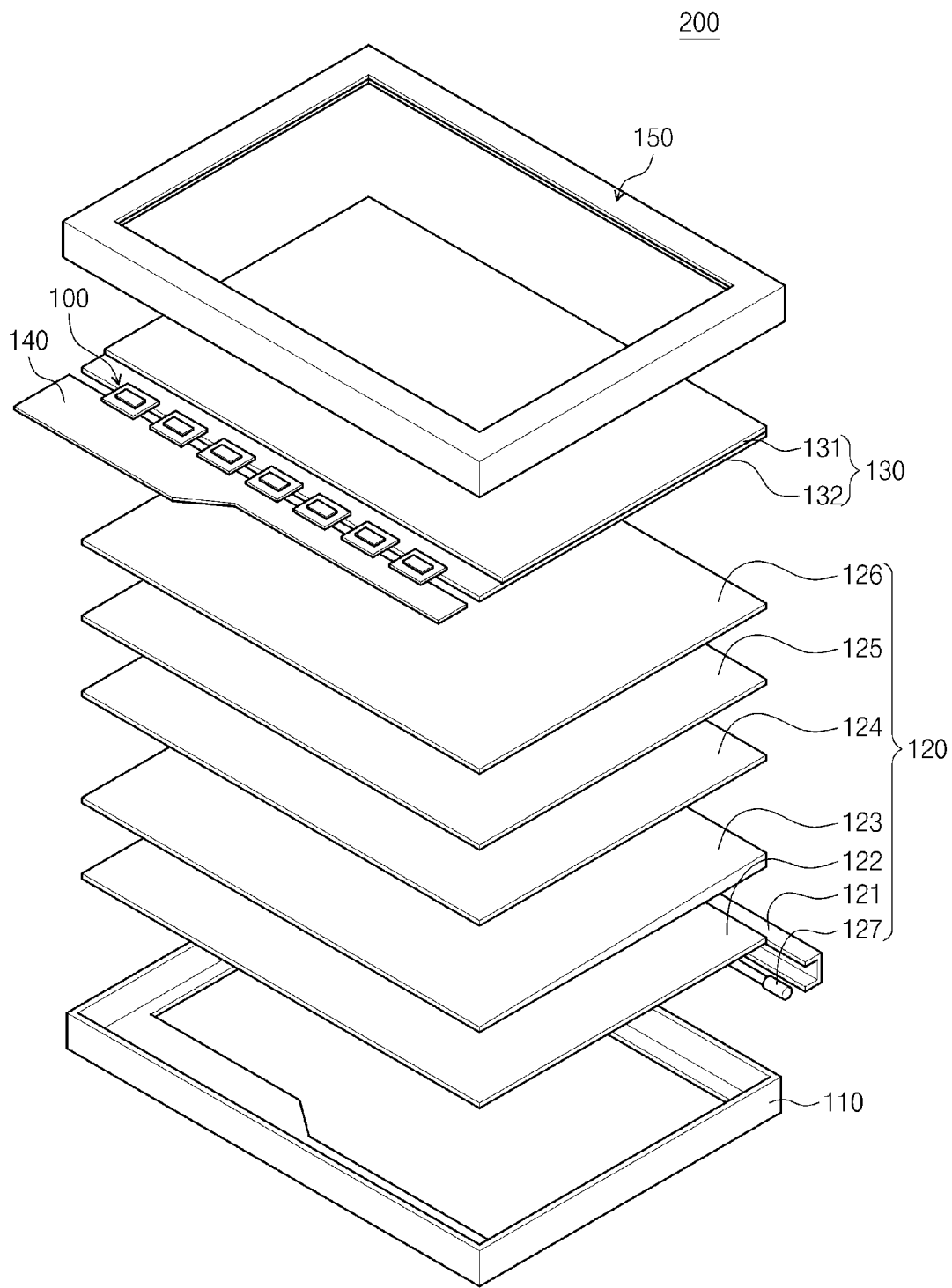
FIG. 8 is an exploded perspective view illustrating an example of device assemblies including chip-on-film packages according to some exemplary embodiments.
Figure 9:
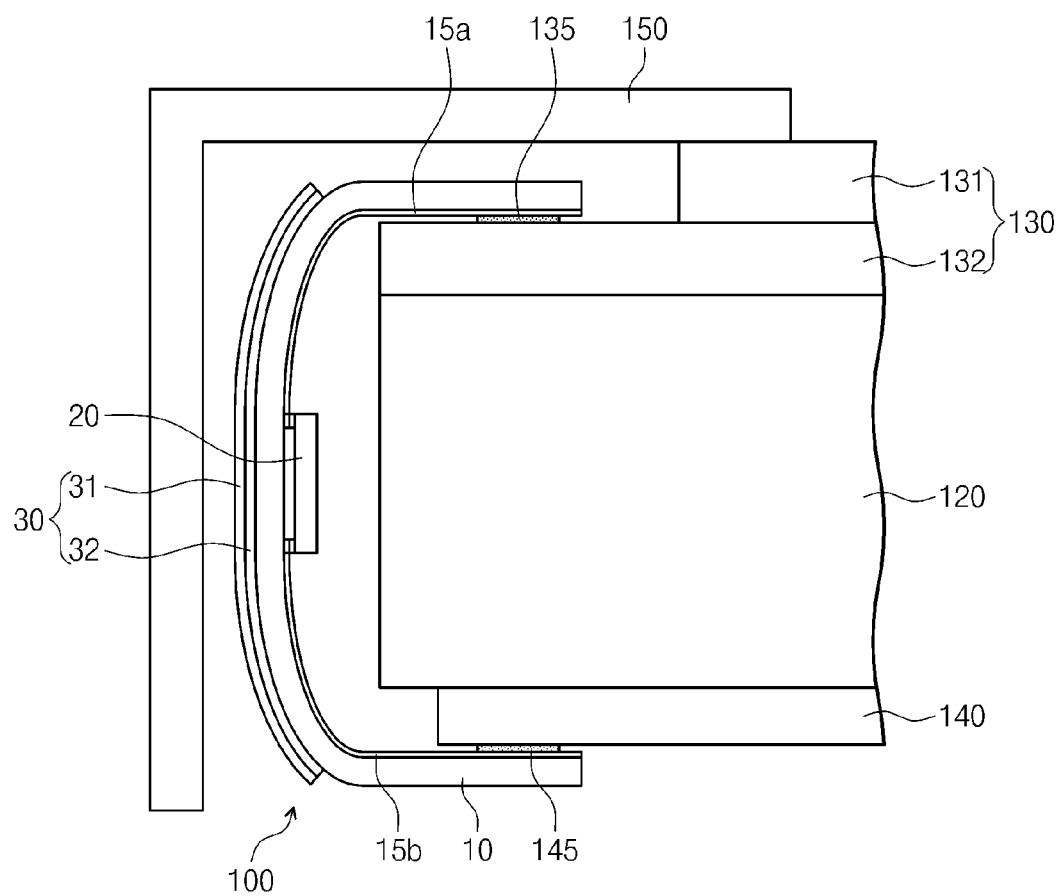
FIG. 9 is a cross sectional view illustrating a portion of a combined device assembly of FIG. 8, according to an exemplary embodiment.

FIG. 8 is an exploded perspective view illustrating an example of device assemblies including chip-on-film packages according to some exemplary embodiments, and FIG. 9 is a cross sectional view illustrating a portion of a combined device assembly of FIG. 8. FIG. 10 is a cross sectional view illustrating a transformed shape of the device assembly of FIG. 9 when a semiconductor chip in the device assembly is heated up, according to one exemplary embodiment.

Referring to FIGS. 8 and 9, a device assembly 200 according to an exemplary embodiment may be a liquid crystal display (LCD) apparatus. The device assembly 200 may include a display panel 130 for displaying an image, a panel driver 100 and 140, a back light assembly 120, a lower frame 110 and an upper frame 150. The display panel 130 may be, for example, a liquid crystal panel. In one embodiment, the display panel 130 may include a thin film transistor substrate 132 and a color filter substrate 131 which are opposite to each other. A liquid crystal material (not shown) may be provided between the thin film transistor substrate 132 and the color filter substrate 131, and an image may be displayed on the display panel 130 by adjusting the light transmittance of the liquid crystal material using thin film transistors that are arrayed in a matrix form on the thin film transistor substrate 132 to act as switching elements. A plurality of gate lines and a plurality of data lines are disposed on the thin film transistor substrate 132, and the gate lines are disposed to intersect the data lines. The thin film transistors may be disposed at pixel regions that the gate lines and the data lines intersect. The thin film transistors may transmit image signals supplied from the data lines to pixel electrodes in response to scanning signals supplied from the gate lines. The image signals may be charged at the pixel electrodes to generate pixel voltages, and the pixel voltages may be applied to the liquid crystals. The gate lines may be connected to a gate driver integrated circuit (IC), and the gate driver IC may be mounted or formed on a portion of the thin film transistor substrate 132.

The panel driver, shown collectively as 100 and 140, may control the operation of the display panel 130, and may include a printed circuit board 140 and chip-on-film packages 100. The chip-on-film packages 100 may be disposed between the printed circuit board 140 and the display panel 130 to electrically connect the printed circuit board 140 to the display panel 130. Each of the chip-on-film packages 100 may have the same configuration as any one of the exemplary embodiments described with reference to FIGS. 1 to 7. The semiconductor chip 20 included in each of the chip-on-film packages 100 may correspond to the gate driver IC connected to the gate lines or data driver IC connected to the data lines. Each of the chip-on-film packages 100 may be connected to both the printed circuit board 140 and the display panel 130 using a tape carrier package (TCP) bonding technique. The first interconnections 15a of the chip-on-film packages 100 may be electrically connected to the thin film transistor substrate 132 through first terminals 135 of the thin film transistor substrate 132, and the second interconnections 15b of the chip-on-film packages 100 may be electrically connected to the printed circuit board 140 through second terminals 145 of the printed circuit board 140. The printed circuit board 140 may include circuits that generate timing signals, image signals and/or power signals. The semiconductor chip 20 may receive signals supplied from the printed circuit board 140 through the second interconnections 15b and may generate the gate line signals and/or data line signals. The gate line signals and/or the data line signals may be applied to the gate lines and/or the data lines of the thin film transistor substrate 132 through the first interconnections 15a.

The back light assembly 120 may supply light toward the display panel 130. The back light assembly 120 may include a light source unit 127, a reflection sheet 122, a light guide plate 123, a diffusion sheet 124, a prism sheet 125 and a protection sheet 126. The light source unit 127 may include at least one lamp or at least one light emitting diode (LED). FIG. 8 illustrates an example that the light source unit 127 is a lamp. In the event that the light source unit 127 is a lamp, the back light assembly 120 may further include a lamp cover 121 to improve a light efficiency of the light source unit 127 and to protect the light source unit 127. The reflection sheet 122 may reflect the light from the light source unit 127 toward the light guide plate 123. Thus, the reflection sheet 122 may reduce the loss of the light from the light source unit 127 to enhance the display efficiency of the device assembly 200. The light guide plate 123 may introduce the light from the light source unit 127 onto the diffusion sheet 124. The diffusion sheet 124 may diffuse the light from the light guide plate 123, and the prism sheet 125 may concentrate the diffused light from the diffusion sheet 124 to generate parallel rays of light that travel along a perpendicular direction to the display panel 130. The protection sheet 126 may protect a surface of the prism sheet 125 from an external shock or impact.

The lower frame 110 may accommodate the display panel 130, the panel driver 100 and 140, and the back light assembly 120. The upper frame 150 may surround an upper portion of the display panel 130 and may fix the display panel 130. Each of the lower and upper frames may comprise a pre-formed structure made of, for example, a heat conductive material (e.g., a metal). The frames may therefore serve as an encasing structure that forms an outer casing holding the device assembly 200 together.

Figure 10:
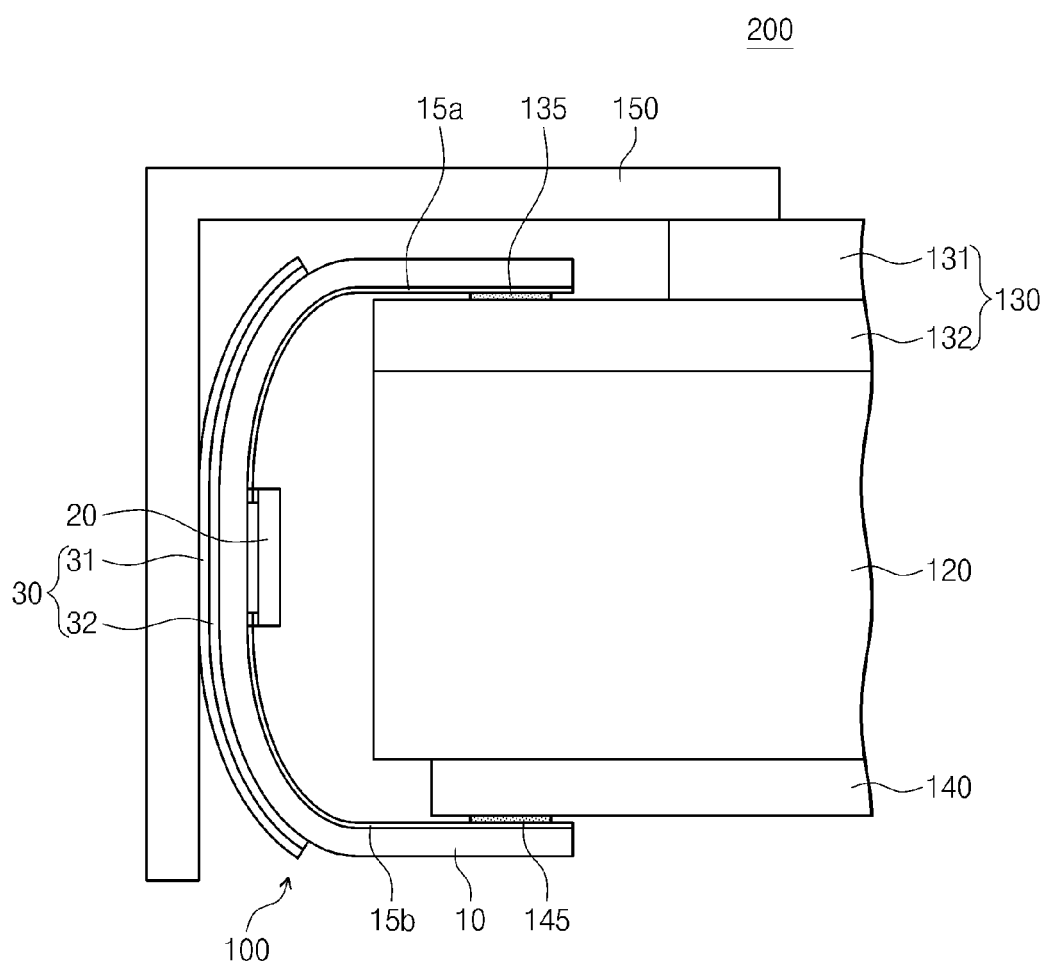
FIG. 10 is a cross sectional view illustrating a transformed shape of the device assembly of FIG. 9 when a semiconductor chip in the device assembly is heated up, according to one exemplary embodiment.

Referring to FIG. 10, the semiconductor chip 20 may be heated up while the device assembly 200 operates. If the semiconductor chip 20 is heated up, the thermal deformation member 30 may bend to be more warped so that a portion of the chip-on-film package contacts the upper frame 150 and/or the lower frame 110 since the thermal expansion coefficient of the high expansion member 31 is greater than that of the low expansion member 32. In one embodiment, where a film such as shown in FIG. 3 is used, the thermal deformation member 30 may contact the upper frame 150 as a result of the warpage. In another embodiment, where a film such as shown in FIG. 4 is used, a part of the film substrate 10 bent by the thermal deformation member 30 may contact the upper frame 150 as a result of the warpage. In one embodiment, the change in curvature is sufficient to cause the chip-on-frame package to contact the upper frame 150 (e.g., a change of 1%, 5%, 10%, etc.), depending on the distance between the chip-on-film package and the upper frame 150 at a non-operating temperature.

As a result of the warpage and the contact between the chip-on-film package and the upper frame 150, the heat generated from the semiconductor chip 20 may be conducted to the upper frame 150 and/or the lower frame 110 through the thermal deformation member 30. As a result, the thermal deformation member 30 may assists the film substrate in expanding and contracting, in order to improve the heat radiation efficiency of the device assembly 200 throughout the life of the device assembly 200.

Referring to FIGS. 8, 9 and 10, any one of the chip-on-film packages 100 according to some exemplary embodiments may be employed in the LCD apparatus. However, the exemplary embodiments are not limited to the LCD apparatus. For example, the chip-on-film packages 100 according to some exemplary embodiments may be applied to portable terminal units such as cellular phones or personal digital assistants (PDAs), laptop computers, or display units such as plasma display panels.

FIGS. 9 and 10 disclose the device assembly including the chip-on-film package 100 illustrated in FIG. 2 or FIG. 3. However, the chip-on-film package 100 in FIGS. 9 and 10 may be replaced with any one of the chip-on-film packages illustrated in FIGS. 4 and 5.

Figure 11:
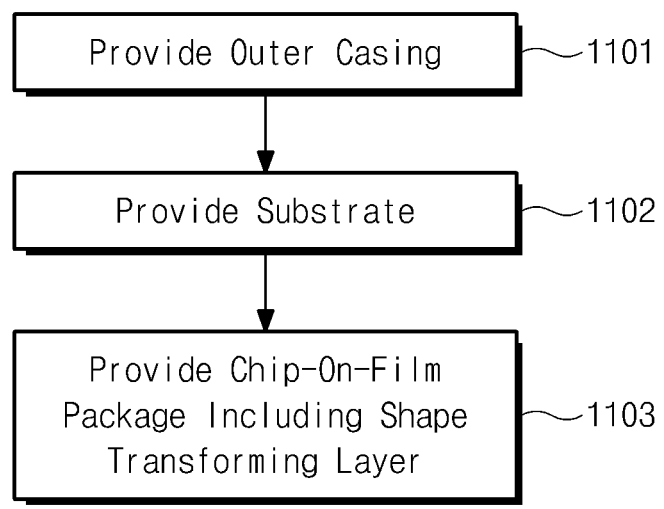
FIG. 11 is an exemplary method of manufacturing a device, according to one exemplary embodiment.

FIG. 11 shows a method 1100 of manufacturing a device, according to one exemplary embodiment. As shown in FIG. 11, in step 1101, an outer casing is provided. In certain embodiments, the outer casing may be a frame for a display panel, as discussed with regard to FIGS. 8-10. However, the outer casing is not limited as such. In one embodiment, the outer casing is formed of a heat-conductive material, such as a metal. In step 1102, a substrate including circuitry is provided. For example, in one embodiment, the substrate may be a thin film transistor substrate that includes an integrated circuit formed of transistors, data lines, gate lines, and/or other circuitry. The thin transistor substrate may be part of a display panel. In step 1103, a chip-on-film package is provided that is electrically connected to the substrate and is disposed between the outer casing and the substrate. Although the steps 1101-1103 are shown in a particular numbered order, they need not take place in that order. For example, in one embodiment, the substrate is provided as part of a formed display panel and is electrically connected to the chip-on-film package prior to encasing by the outer casing.

In one embodiment, the chip-on-film package includes a film substrate having a first surface and a second surface opposite to each other, a semiconductor chip on the first surface, and a shape transforming layer disposed between the semiconductor chip and the outer casing. In one embodiment, the shape transforming layer contacts the second surface, though in another embodiment, it does not contact the second surface and is disposed between the first surface and the second surface. The shape transforming layer may include one or more materials configured to adjust the shape of the film substrate when heat is applied to the film substrate. The chip-on-film package may be, for example, a package such as shown in any of FIGS. 1-7.

In one embodiment, after the device is manufactured and when it is not being operated, the outer casing and the chip-on-film package are positioned such that the chip-on-film package including the shape transforming layer does not contact the outer casing. This allows for the shape transformation layer to change its shape and contact the outer casing when the device is being operated and a temperature of the device increases.

In one embodiment, the shape transforming layer includes at least two materials. A first material of the two materials is a high expansion material, and a second material of the two materials is a low expansion material. The second material may be positioned between the first surface of the film substrate and the first material.

According to the embodiments set forth above, a chip-on-film package including a thermal deformation member is provided. The thermal deformation member has a property that a shape is transformed according to a temperature. Thus, if the chip-on-film package including the thermal deformation member is employed in a device assembly such as a display apparatus, the thermal deformation member may be more warped to contact a frame of the device assembly when a semiconductor chip of the chip-on-film package is heated up. Thus, the heat generated from semiconductor chip can be conducted to the frame of the device assembly. As a result, the thermal deformation member may improve the heat radiation efficiency of the device assembly.

While the disclosure has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:
1. A device, comprising:
a display panel;
a frame supporting the display panel; and
a chip-on-film package, the chip-on-film package comprising:
a film substrate having a first surface and a second surface opposite to each other;
a semiconductor chip on the first surface; and
a thermal deformation member adjacent to the second surface,
wherein the thermal deformation member has a construction that causes its shape to transform according to a temperature,
wherein the thermal deformation member has a property that a curvature of the thermal deformation member at a first temperature is greater than a curvature of the thermal deformation member at a second temperature lower than the first temperature; and
wherein the frame and the chip-on-film package are positioned such that when the semiconductor chip is heated up, the chip-on-film package including the thermal deformation member changes curvature to contact the frame.

2. The device of claim 1, wherein the thermal deformation member is a bimetal or a shape memory alloy.

3. The device of claim 2, wherein the bimetal includes a high expansion member and a low expansion member, and a distance between the low expansion member and the semiconductor chip is less than a distance between the high expansion member and the semiconductor chip.

4. The device of claim 1, wherein the thermal deformation member is attached to the second surface.

5. The device of claim 1, wherein the film substrate includes a first film substrate portion having the first surface and a second film substrate portion having the second surface, and the thermal deformation member is disposed between the first film substrate portion and the second film substrate portion.

6. The device of claim 1, wherein the semiconductor chip is disposed on a central portion of the film substrate,
wherein the thermal deformation member has a bar shape in a plan view, and
wherein a width of the thermal deformation member in a first direction is greater than a width of the semiconductor chip in the first direction.

7. The device of claim 6, wherein the semiconductor chip and the thermal deformation member intersect each other to constitute a cross shape in a plan view.

8. The device of claim 6, further comprising:
one or more additional thermal deformation members, wherein the thermal deformation member and the one or more additional thermal deformation members are spaced apart from each other and are parallel with each other.

9. A device assembly comprising:
a display panel;
a frame supporting the display panel; and
a chip-on-film package electrically connected to the display panel and disposed between the frame and the display panel,
wherein the chip-on-film package includes:
a film substrate having a first surface and a second surface opposite to each other;
a semiconductor chip on the first surface; and
a thermal deformation member adjacent to the second surface,
wherein the thermal deformation member has a construction that causes its shape to transform according to a temperature, and
wherein the frame and the chip-on-film package are positioned such that when the semiconductor chip is heated up, the chip-on-film package including the thermal deformation member is warped to contact the frame.

10. The device assembly of claim 9, wherein the frame and the chip-on-film package are positioned such that when the semiconductor chip remains below a certain temperature, the chip-on-film package including the thermal deformation member does not contact the frame, and when the semiconductor chip is heated up above the certain temperature, the chip-on-film package including the thermal deformation member is warped to contact the frame.

11. The device assembly of claim 9, wherein the thermal deformation member is a bimetal that includes a high expansion member and a low expansion member, and a distance between the low expansion member and the semiconductor chip is less than a distance between the high expansion member and the semiconductor chip.

12. The device assembly of claim 9, wherein the thermal deformation member is attached to the second surface.

13. The device assembly of claim 9, wherein the film substrate includes a first film substrate portion having the first surface and a second film substrate portion having the second surface, and the thermal deformation member is disposed between the first film substrate portion and the second film substrate portion.

14. The device assembly of claim 9, wherein the semiconductor chip is disposed on a central portion of the film substrate, wherein the thermal deformation member has a bar shape in a plan view, and
wherein a width of the thermal deformation member in a first direction is greater than a width of the semiconductor chip in the first direction.

15. A device comprising:
a display panel;
a frame supporting the display panel;
a chip-on-film substrate having a first surface and a second surface opposite to each other, the chip-on-film substrate having first leads extending toward a first edge of the chip-on-film substrate and second leads extending toward a second edge of the chip-on-film substrate opposite the first edge of the chip-on-film substrate;
a semiconductor chip on the first surface of the chip-on-film substrate;
a thermal deformation member on the second surface of the chip-on-film substrate; and
a chip-on-film package that includes the chip-on-film substrate, the semiconductor chip, and the thermal deformation member,
wherein, when viewed in a plan view, the thermal deformation member covers an area smaller than the area covered by the chip-on-film substrate and has a length in a direction extending from the first edge of the chip-on-film substrate to the second edge of the chip-on-film substrate smaller than the length between the first edge of the chip-on-film substrate and the second edge of the chip-on-film substrate,
wherein the thermal deformation member has a construction that causes its shape to be curved at room temperature and to transform according to a change in temperature, and
wherein the frame and the chip-on-film package are positioned such that when the semiconductor chip is heated up, the chip-on-film package including the thermal deformation member changes curvature to contact the frame.

16. The device of claim 15, wherein the semiconductor chip and the thermal deformation member intersect each other to constitute a cross shape in a plan view.

17. The device of claim 15, wherein the frame and the chip-on-film package are positioned such that when the semiconductor chip remains below a certain temperature, the chip-on-film package including the thermal deformation member does not contact the frame, and when the semiconductor chip is heated up above the certain temperature, the chip-on-film package including the thermal deformation member changes curvature to contact the frame.

* * * * *